United States Patent
DeCesaris et al.

(10) Patent No.: US 9,026,685 B2
(45) Date of Patent: *May 5, 2015

(54) MEMORY MODULE COMMUNICATION CONTROL

(71) Applicant: International Business Machines Corporation, Armonk, NY (US)

(72) Inventors: Michael DeCesaris, Carrboro, NC (US); James J. Parsonese, Cary, NC (US); Luke D. Remis, Raleigh, NC (US); Gregory D. Sellman, Morrisville, NC (US)

(73) Assignee: Lenovo Enterprise Solutions (Singapore) Pte. Ltd., Serangoon Garden (SG)

( * ) Notice: Subject to any disclaimer, the term of this patent is extended or adjusted under 35 U.S.C. 154(b) by 128 days.

This patent is subject to a terminal disclaimer.

(21) Appl. No.: 13/961,931

(22) Filed: Aug. 8, 2013

(65) Prior Publication Data

US 2015/0046615 A1 Feb. 12, 2015

Related U.S. Application Data

(63) Continuation of application No. 13/960,883, filed on Aug. 7, 2013, now Pat. No. 8,954,619.

(51) Int. Cl.
| | |
|---|---|
| G06F 13/00 | (2006.01) |
| G06F 13/16 | (2006.01) |
| G11C 14/00 | (2006.01) |
| G06F 13/32 | (2006.01) |
| G06F 13/40 | (2006.01) |
| G06F 13/24 | (2006.01) |
| G06F 13/10 | (2006.01) |

(52) U.S. Cl.
CPC ........ *G06F 13/1689* (2013.01); *G11C 14/0045* (2013.01); *G06F 13/32* (2013.01); *G06F 13/4022* (2013.01); *G06F 13/10* (2013.01); *G06F 13/102* (2013.01); *G06F 13/24* (2013.01)

(58) Field of Classification Search
CPC ............................ G06F 13/102; G06F 13/10
See application file for complete search history.

(56) References Cited

U.S. PATENT DOCUMENTS

| | | |
|---|---|---|
| 7,506,066 B2 | 3/2009 | Nobakht et al. |
| 2006/0005000 A1 | 1/2006 | King et al. |
| 2010/0205348 A1 | 8/2010 | Moshayedi et al. |
| 2010/0220735 A1 | 9/2010 | Vermunt et al. |

(Continued)

FOREIGN PATENT DOCUMENTS

| | | |
|---|---|---|
| WO | WO2010093356 A1 | 8/2010 |
| WO | WO2011059448 A1 | 5/2011 |

OTHER PUBLICATIONS

Office Action dated Aug. 7, 2013 for U.S. Appl. No. 13/960,883.
White Paper; Flash DIMM Technology, Hewlett Packard, Feb. 10, 1998.
ARM Generic Interrupt Controller, Architecture Specification, Version 2.0, ARM IHI 0048B, ARM Limited, 2008, 2011.

(Continued)

*Primary Examiner* — Zachary K Huson
(74) *Attorney, Agent, or Firm* — Olive Law Group, PLLC

(57) ABSTRACT

Methods and systems for memory module communication control are disclosed. A method includes receiving a message associated with a memory module in communication with a controller via a bus including a clock line. Further, the method includes determining whether the bus is idle. The method also includes communicating a signal via the clock line regarding the message associated with the memory module in response to determining that the bus is idle.

20 Claims, 2 Drawing Sheets

(56) References Cited

U.S. PATENT DOCUMENTS

| | | |
|---|---|---|
| 2012/0042137 A1 | 2/2012 | Takeishi et al. |
| 2012/0198136 A1 | 8/2012 | Moshayedi et al. |
| 2012/0329377 A1 | 12/2012 | Wu |
| 2013/0031303 A1 | 1/2013 | Jeddeloh |
| 2013/0080799 A1 | 3/2013 | Artman et al. |
| 2014/0189177 A1* | 7/2014 | Flint et al. ............... 710/110 |

OTHER PUBLICATIONS

DDR Interface Drive Strength, Texas Instruments Embedded Processors Wiki; weblink: http://processors.wiki.ti.com/index.php/DDR_Interface_Drive_Strength; last accessed May 15, 2013, 3 pages.

Lefurgy et al., Active Management of Timing Guardband to Save Energy in Power7; Micro 44, Dec. 3-7, 2011, Porto Alegre, Brazil, Copyright 2011 ACM 978-1-4503-1053—Jun. 11, 2012.

* cited by examiner

MEMORY MODULE COMMUNICATION CONTROL

CROSS-REFERENCE TO RELATED APPLICATIONS

This is a continuation application of copending U.S. patent application Ser. No. 13/960,883, filed Aug. 7, 2013, and titled MEMORY MODULE COMMUNICATION CONTROL, the content of which is hereby incorporated by reference in its entirety.

BACKGROUND

1. Field of the Invention

The present invention relates to computer memory, and more specifically, to memory module communication control.

2. Description of Related Art

A dual in-line memory module (DIMM) includes a series of dynamic random-access memory integrated circuits. These modules are mounted on a printed circuit board (PCB) and designed for use in computing devices, such as desktop computer, laptop computers, and servers. A non-volatile DIMM (NVDIMM) is a DRAM DIMM module that retains data even during loss of power. NVDIMMs are used in server systems to improve application performance, data security, system crash recovery time, and reliability.

In a server, multiple DIMMs may be managed and controlled by a baseboard management controller (BMC). There is a need to manage the communication between a DIMM and the controller. In particular example, since NVDIMMs are slower than typical DIMMs, they may sometimes require the BMC to return for service at a later time. A processor of the BMC may be notified to return for service by the NVDIMM asserting an interrupt into the processor. As a result, the processor may be instructed to read a status register in the NVDIMM via double data rate (DDR). However, this action results in inefficiency because an additional control signal is routed from the memory subsystem to the processor subsystem for each DIMM socket supporting the NVDIMM.

In view of the foregoing, there is a need for improved techniques of memory module communication control.

BRIEF SUMMARY

In accordance with one or more embodiments of the present invention, methods and systems disclosed herein provide for memory module communication control. According to an aspect, a method includes receiving a message associated with a memory module in communication with a controller via a bus including a clock line. Further, the method includes determining whether the bus is idle. The method also includes communicating a signal via the clock line regarding the message associated with the memory module in response to determining that the bus is idle.

According to another aspect, a method includes receiving an interrupt for a memory module in communication with a controller via a bus including a clock line. The method also includes determining whether the bus is idle. Further, the method includes driving the clock line low; and communicating a stop command to one or more other memory modules in response to determining that the bus is not idle.

According to another aspect, a method may be implemented at a master device in a computer bus system. The method may include receiving a signal via a clock line. Further, the method may include communicating a message associated with the signal to one or more other devices.

DETAILED DESCRIPTION

As described herein, there are various embodiments and aspects of the present invention. According to embodiments, the present invention is directed to systems and methods for memory module communication control.

Figure 1:
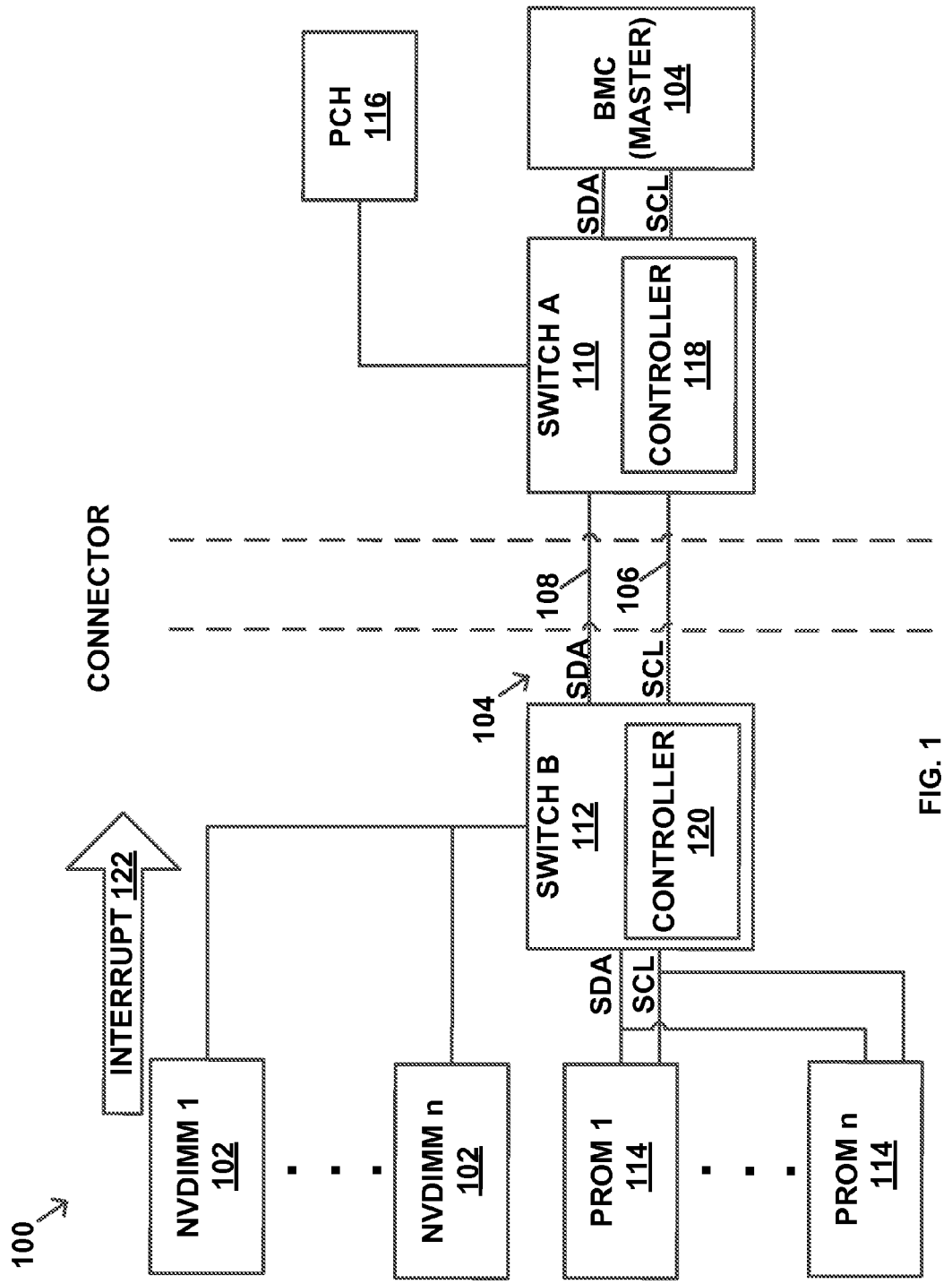
FIG. 1 is a block diagram of an example system operable for memory module communication control in accordance with embodiments of the present invention.

Referring now to FIG. 1, the figure illustrates a block diagram of an example system 100 operable for memory module communication control in accordance with embodiments of the present invention. In this example, the system 100 includes multiple NVDIMM 1 102—NVDIMM n 102 and a BMC 104. The BMC 104 may include a processor and be configured to control each NVDIMM 102. In this example, the BMC 104 functions as an $I^2C$ master. $I^2C$ is a multimaster serial single-ended computer bus system. The BMC 104 may communicate with the NVDIMMs 102 via a bus 104 including a serial clock line (SCL) 106 and a signal data line (SDA) 108. The bus 104 may be an $I^2C$ bus or any other suitable type of bus. The bus 104 may include a connector for physically connecting a switch A 110 serving the BMC 104 with a switch B 112 serving the NVDIMMs 102. The system 100 may also include multiple programmable read-only memory (PROM) devices 114 capable of communication with the BMC 104 via switches 110 and 112 and the bus 104.

The system 100 may include a platform controller hub (PCH) 116 capable of working in conjunction with the BMC 104. The PCH 116 may function as a system clock, provide a flexible display interface (FDI), and provide a direct media interface (DMI).

Figure 2:
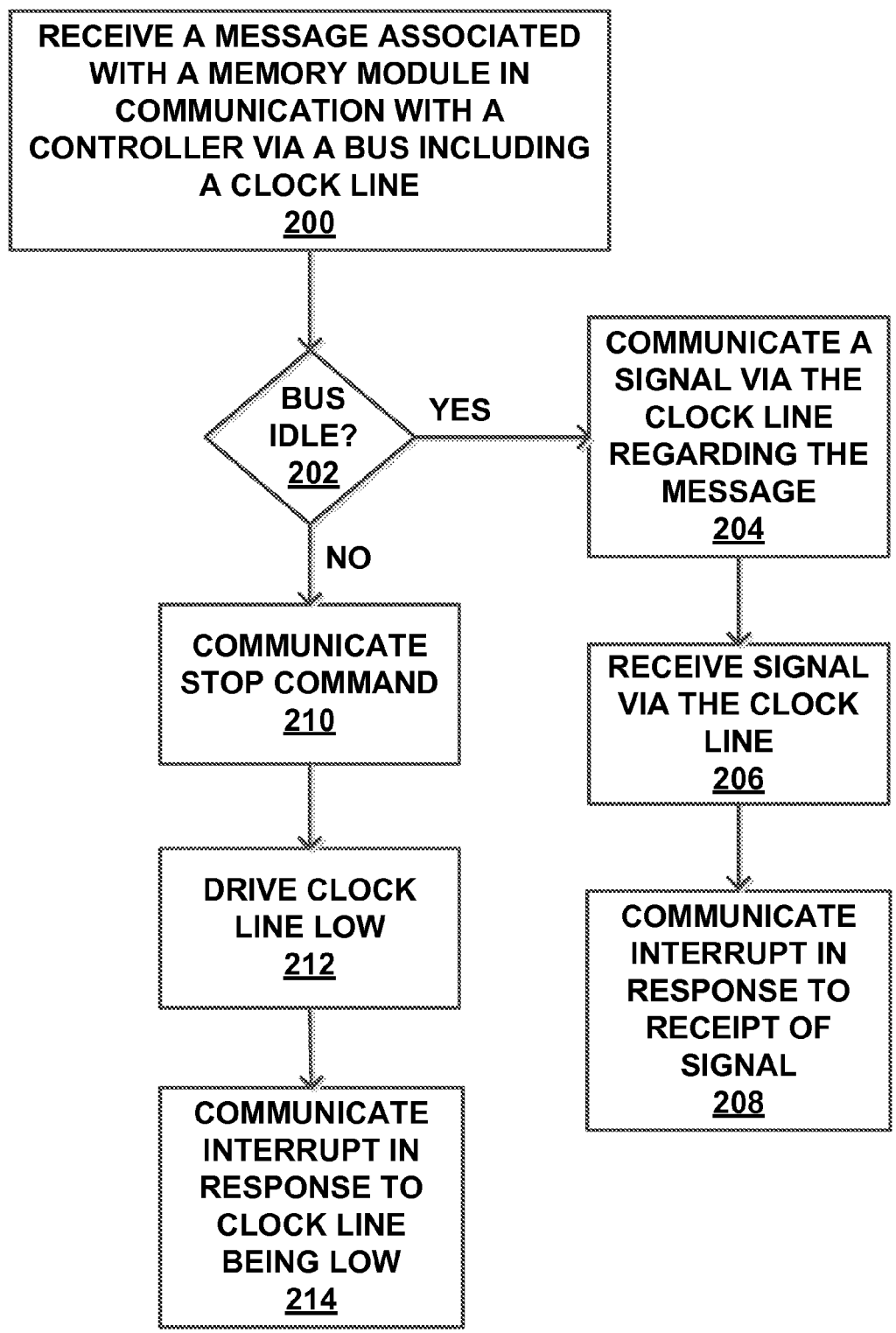
FIG. 2 is a flowchart of an example method for memory module communication control in accordance with embodiments of the present invention.

FIG. 2 illustrates a flowchart of an example method for memory module communication control in accordance with embodiments of the present invention. In examples described herein to illustrate the method, reference is made to controllers 118 and 120 of switches 110 and 112, respectively, shown in FIG. 1, although any suitable controllers may be utilized. Further, the method is described in examples as being implemented in a NVDIMM system with the components shown in FIG. 1, although the method may be implemented in any suitable system having one or more memory modules. Each of the controllers 118 and 120 may be implemented by hardware, software, firmware, or combinations thereof.

Referring now to FIG. 2, the method includes receiving 200 a message associated with a memory module in communication with a controller via a bus including a clock line. For example, NVDIMM 1 102 shown in FIG. 1 may generate an interrupt 122 and communicate the interrupt 122 to the switch B 112 for communication to the PCH 116. The controller 120 may receive the interrupt 122. Alternative to an interrupt, the message received at the switch 112 may be any other message addressed for delivery via the bus 104.

The method of FIG. 2 includes determining 202 whether the bus is idle. Continuing the aforementioned example, the controller 120 may determine whether the bus 104 is idle. A bus may not be idle when it is conducting a transaction or communicating. In response to determining that the bus is idle, the method includes communicating 204 a signal via the clock line regarding the message associated with the memory module. For example, the controller 120 may signal the interrupt 122 to the switch A 110 via the SCL 106 for routing to the PCH 116. As an example, the switch B 112 may drive the SCL 106 low in response to receipt of the interrupt for signaling the interrupt. The switch B 112 may drive the SCL 106 low for signaling the interrupt only when the bus 104 is idle. Such action is acceptable under $I^2C$ protocol, because devices on the bus can view this behavior as a clock stretch.

Subsequent to the communication 204, the method includes communicating a message in response to receipt of the signal. For example, the controller 118 of switch A 110 may communicate an interrupt to the PCH 116 in response to receipt of the signal via the SCL 106. The controller 118 may recognize the signal as indicating an interrupt from one of the NVDIMMs 102 and subsequently send the interrupt.

In response to determining that the bus is not idle, the method includes communicating 210 a stop command. For example, the controller 120 may generate a stop command and send the stop command to associated I2C devices such as the other NVDIMMs 102 and PROMs 114 to thereby instruct these devices to stop communicating with the switch B 112. Subsequently, the method includes driving 212 the clock line low. For example, the controller 120 can control the switch B 112 to drive SCL 106 from between 1.0 V and 0.7 V when it is not idle to less than 0.4 V. Subsequently, the method includes communicating 214 an interrupt in response to the clock line being low. For example, the switch A 110 may communicate an interrupt to the PCH 116 in response to the PCL 106 being low. As an example, the switch A 110 can detect a voltage less than 0.7 V on its input, and assert an interrupt signal in response to the detection. As a result of the interrupt signal, processes associated with PCH 116 and BMC 104 may be stopped.

When an interrupt event has completed, the bus can return to normal operation. For example, the bus wires can float to a logical "1" state and if the master would like to communicate with a slave, it can do so by issuing a start command. It is also noted that the master may recover after an interrupt has subsided. In other words, if the master is processing a data transaction and is stopped, it can attempt again to capture the data that was aborted subsequent to the event clearing.

In accordance with embodiments of the present invention, a clock line may be driven to two or more levels for communicating more than one type of message. For example, the switch B 112 may be configured to recognize two or more types of messages. The switch B 112 may be configured to drive the SCL 106 to a particular voltage level based on the received type of message. The switch A 110 may be configured to interrupt the type of message based on the driven voltage level of the SCL 106. In response to detection of the voltage level, the switch A 110 may generate and communicate the message corresponding to the voltage level to an appropriate device such as the PCH 116.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter situation scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
receiving a message associated with a memory module in communication with a controller via a bus including a clock line;
determining whether the bus is idle; and
in response to determining that the bus is idle, communicating a signal via the clock line regarding the message associated with the memory module.

2. The method of claim 1, wherein receiving a message comprises receiving an interrupt from the memory module.

3. The method of claim 1, wherein the memory module is a dual in-line memory module (DIMM).

4. The method of claim 3, wherein receiving a message comprises receiving an interrupt from the memory module.

5. The method of claim 1, wherein the bus is an $I^2C$ bus.

6. The method of claim 1, wherein the clock line is a serial clock line.

7. The method of claim 1, wherein communicating a signal comprises driving the clock line low in response to receipt of the message.

8. A method comprising:
receiving an interrupt for a memory module in communication with a controller via a bus including a clock line;
determining whether the bus is idle; and
in response to determining that the bus is not idle:
driving the clock line low; and
communicating a stop command to one or more other memory modules.

9. The method of claim 8, wherein the memory module is a dual in-line memory module (DIMM).

10. The method of claim 8, wherein the bus is an $I^2C$ bus.

11. The method of claim 8, wherein the clock line is a serial clock line.

12. A method comprising:
at a master device in a computer bus system:
receiving a signal via a clock line; and
communicating a message associated with the signal to one or more other devices.

13. The method of claim 12, wherein the signal indicates receipt of an interrupt from a memory module.

14. The method of claim 12, wherein the memory module is a dual in-line memory module (DIMM).

15. The method of claim 12, wherein the computer bus system is an $I^2C$ bus system.

16. The method of claim 12, wherein the clock line is a serial clock line.

17. The method of claim 12, wherein communicating a message comprises communicating the message to a platform controller hub.

18. The method of claim 17, wherein the message is an interrupt.

19. The method of claim 12, further comprising detecting the signal on the clock line.

20. The method of claim 19, wherein detecting the signal comprises detecting that voltage on the clock line is driven below a predefined voltage level.

\* \* \* \* \*